United States Patent [19]

Goodman

[11] 3,871,728

[45] Mar. 18, 1975

[54] MATCHED IMPEDANCE PRINTED CIRCUIT BOARD CONNECTOR

[75] Inventor: David S. Goodman, Orange, Calif.

[73] Assignee: International Telephone and Telegraph Corporation, New York, N.Y.

[22] Filed: Nov. 30, 1973

[21] Appl. No.: 420,532

[52] U.S. Cl. .................... 339/14 R, 339/17, 339/19, 339/176 MP, 339/217 R

[51] Int. Cl. ........................... H01v 3/06, H05k 1/07

[58] Field of Search ............. 339/14, 17, 18, 19, 75, 339/176, 186, 184, 177, 21

[56] References Cited

UNITED STATES PATENTS

| | | | |
|---|---|---|---|
| 3,399,372 | 8/1968 | Uberbacher | 339/14 R X |
| 3,482,201 | 12/1969 | Schneck | 339/176 MP X |
| 3,587,029 | 6/1971 | Knowles | 339/14 R |
| 3,634,806 | 1/1972 | Fergusson | 339/14 R |
| 3,689,865 | 9/1972 | Pieriui et al. | 339/17 L |
| 3,710,303 | 1/1973 | Gallager, Jr. | 339/61 M |
| 3,737,838 | 6/1973 | Mattingly, Jr. et al. | 339/186 M |
| 3,778,754 | 12/1973 | Takahashi et al. | 339/176 M |

*Primary Examiner*—William H. Schultz
*Assistant Examiner*—Terrell P. Lewis
*Attorney, Agent, or Firm*—Thomas L. Peterson

[57] ABSTRACT

A matched impedance printed circuit board connector comprising a housing mounted on a mounting board having a ground plane and signal traces separated by an insulator. A grounding bus extends lengthwise in the housing below the printed circuit board receiving slot therein. Signal contacts in the housing are mounted in plated through holes in the mounting board which are connected to the signal traces. The grounding bus has mounting portions which are mounted in other plated through holes in the board which are joined to the ground plane. Ground contacts are also provided in the housing which are mounted in additional plated through holes which are also joined to the ground plane so that the ground contacts and grounding bus are electrically interconnected. Preferably two such ground contacts are positioned on opposite sides of the signal contacts.

8 Claims, 4 Drawing Figures

MATCHED IMPEDANCE PRINTED CIRCUIT BOARD CONNECTOR

BACKGROUND OF THE INVENTION

The present invention relates generally to a printed circuit board connector and, more particularly, to such a connector which embodies matched impedance characteristics.

Modern data processing systems require that logic decisions be made in a matter of nanoseconds rather than milli or microseconds. In this range of decision speed, circuit designers have found that signal rise times are so fast as to require the utilization of transmission line techniques. While printed circuit boards have previously been manufactured with no particular attention to the impedance characteristics of the circuit lines, printed circuits must now be constructed with all the characteristics of transmission lines, with signal conductors placed a known preset distance from a reference ground plane and terminated to prevent reflections. While printed circuit boards can be built with these characteristics, unless the entire packaging system is provided with the desired transmission line characteristics, the overall system is degraded and is unable to achieve the desired operating speed.

One weak area in packaging systems has been the connectors which interconnect circuit boards to various other portions of the system. One technique used in the art for providing transmission line interconnections between printed circuit boards employs discreet coaxial cables which must be individually connected between the boards. This technique is disclosed in detail in U.S. Pat. No. No. 3,689,865. While satisfactory from a technical standpoint, this technique leaves much to be desired on the basis of reliability and cost. Moreover, such connectors are bulky and reduce the interconnection density to an undesirable low level. Other types of printed circuit boards designed to maintain circuit line impedance characteristics are disclosed in U.S. Pat. Nos. 3,401,369 and 3,710,303. While these connectors constitute improvements upon the connectors employing discreet coaxial cables, such connectors are limited in their flexibility of design.

The present invention constitutes an improvement upon the printed circuit board connector disclosed in U.S. Pat. No. 3,737,838 to Mattingly et al, assigned to the assignee as the present application, by modifying such connector so that it embodies matched impedance characteristics. The connector is relatively low in cost and embodies greater flexibility in design than does the prior art matched impedance connectors discussed above.

SUMMARY OF THE INVENTION

According to the principal aspect of the present invention, there is provided a matched impedance printed circuit board connector comprising a mounting board having a ground plane and signal traces separated by an insulator. An insulative housing is mounted on the board having a slot therein for receiving the edge of a printed circuit board. A vertically extending grounding bus extends lengthwise in the housing below such slot. Signal contacts are mounted in plated through holes in the mounting board which are joined to the signal traces. The grounding bus and ground contacts in the housing are mounted in plated through holes in the mounting board which are joined to the ground plane whereby the ground contacts and grounding bus are electrically interconnected. The grounding bus minimizes the air gap in the ground system, that is, between the ground traces on the edge board which is mounted in the connector and the ground plane in the mounting board. Preferably the ground contacts are mounted on opposite sides of each signal contact so that the ground contacts, together with the grounding bus, provide an arrangement simulating a coaxial transmission line, thus producing essentially matched impedance characteristics.

Other aspects and advantages of the invention will become more apparent from the following description taken in connection with the accompanying drawings.

DESCRIPTION OF THE PREFERRED EMBODIMENT

Figure 1:
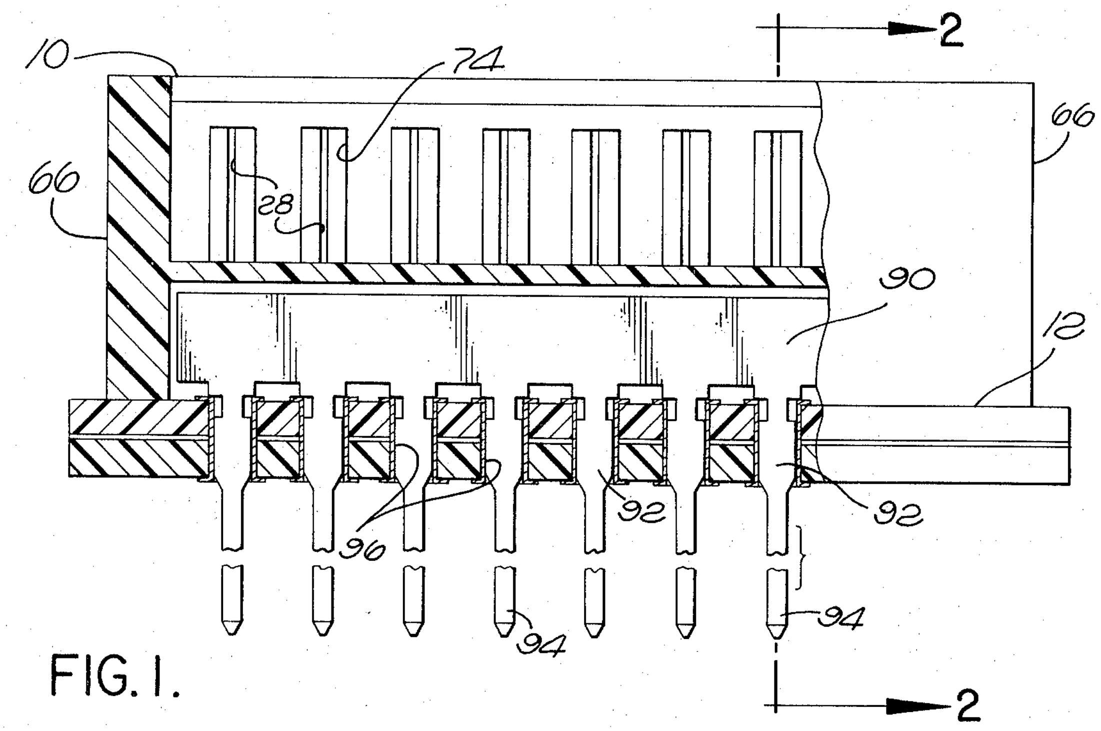
FIG. 1 is a longitudinal partial vertical sectional view showing the connector assembly of the present invention.

Referring now to the drawings in detail, there is illustrated in FIG. 1 the preferred embodiment of the connector assembly of the present invention, comprising an elongated insulative connector housing 10 mounted on a planar mounting board 12. The connector is shown as being a double-sided printed circuit board connector. Two parallel rows of plated through holes 14 and 16, respectively, extend perpendicularly through the board 12. Adapted to be positioned in each of the holes are a plurality of electrical contacts 18. The contacts are formed of a terminal portion 20 and spring contacting portion 22, with the portions 20 and 22 being interconnected by a central mounting portion 24. The contacts are mounted in the holes 14 and 16 as opposed pairs with the contacting portions thereof positioned closely adjacent to each other. The contacts are preferably stamped from suitable metal stock to provide the desired strength.

The terminal portions 20 of the contacts are generally square in cross section and may be tapered at their tip ends 26 to facilitate insertion of the contacts into the holes 14 and 16. The spring contacting portions are shown as being bifurcated by means of slots 28 which open at the tip end 30. The bifurcated spring contacting portions of the opposed pairs of contacts provide redundant contact points to conductive traces 32 and 33 on opposite sides of a printed circuit board 34 inserted through a slot 36 in the top of the housing 10. In the embodiment illustrated, the trace 32 is a ground trace and the trace 33 is a signal trace. The spring portion 22 contains a shank end 38 which interconnects the mounting portion 24 to the bifurcated end of the contact. Normally the spring portion is tapered from the shank end 38 to the outer tip end 30 of the contact.

The central mounting portion 24 which interconnects the shank end 38 and the terminal portion 18 is of an approximately equal thickness. However, the mounting portion is slightly wider than the shank end 38 at their junction so as to define an upwardly facing shoulder 40. At its junction with the terminal portion 20, tapered transitional section 42 provides the width transition between the terminal portion and the lower end 44 of the mounting portion. The lower end 44 of the mounting portion is not as wide as the upper end 46, thereby defining a downwardly facing shoulder 48. The width of the lower end 44 is approximately equal to the diameter of the holes 14 and 16 so that when the contacts are inserted into the holes, the shoulder 48 will rest on the top surface of the mounting board 12 correctly positioning the contacts thereon. The width of the lower end 44 of the mounting portion of each contact is slightly greater than the diameter of the plated through holes 14 and 16 so that the contact will have an interference fit with the holes.

The housing 10 includes a pair of sidewalls 64 and end walls 66. The side walls 64 terminate at a top wall 68. The printed circuit board receiving slot 36 is formed in this top wall and splits the wall into symmetrical portions. Downwardly depending lips 70 are formed along the symmetrical portions of the top wall 68 adjacent to the slot 36. These lip portions engage the upper ends 30 of the contacts to preload the same when the housing 10 is mounted over the contacts onto the board 12. The housing is retained on the board by the frictional engagement between the upper ends 46 of the mounting portions 24 of the contacts and downwardly facing slots 72 formed in partition walls 74 which extend laterally in the housing and define the cavities for receiving the contacts.

It should be noted that the connector assembly described so far is essentially identical to that described and disclosed in the aforementioned Mattingly et al. patent, and constitutes no part of the present invention.

Figure 2:
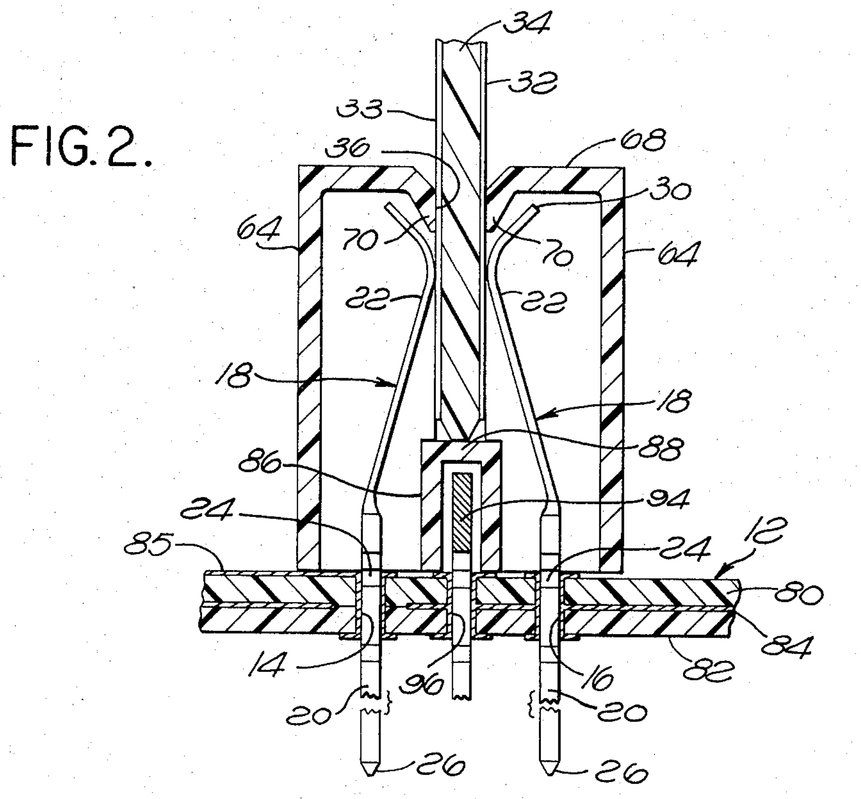
FIG. 2 is a transverse vertical sectional view taken along line 2—2 of FIG. 1, with the edge of a printed circuit board being shown mounted in the connector.
Figure 3:
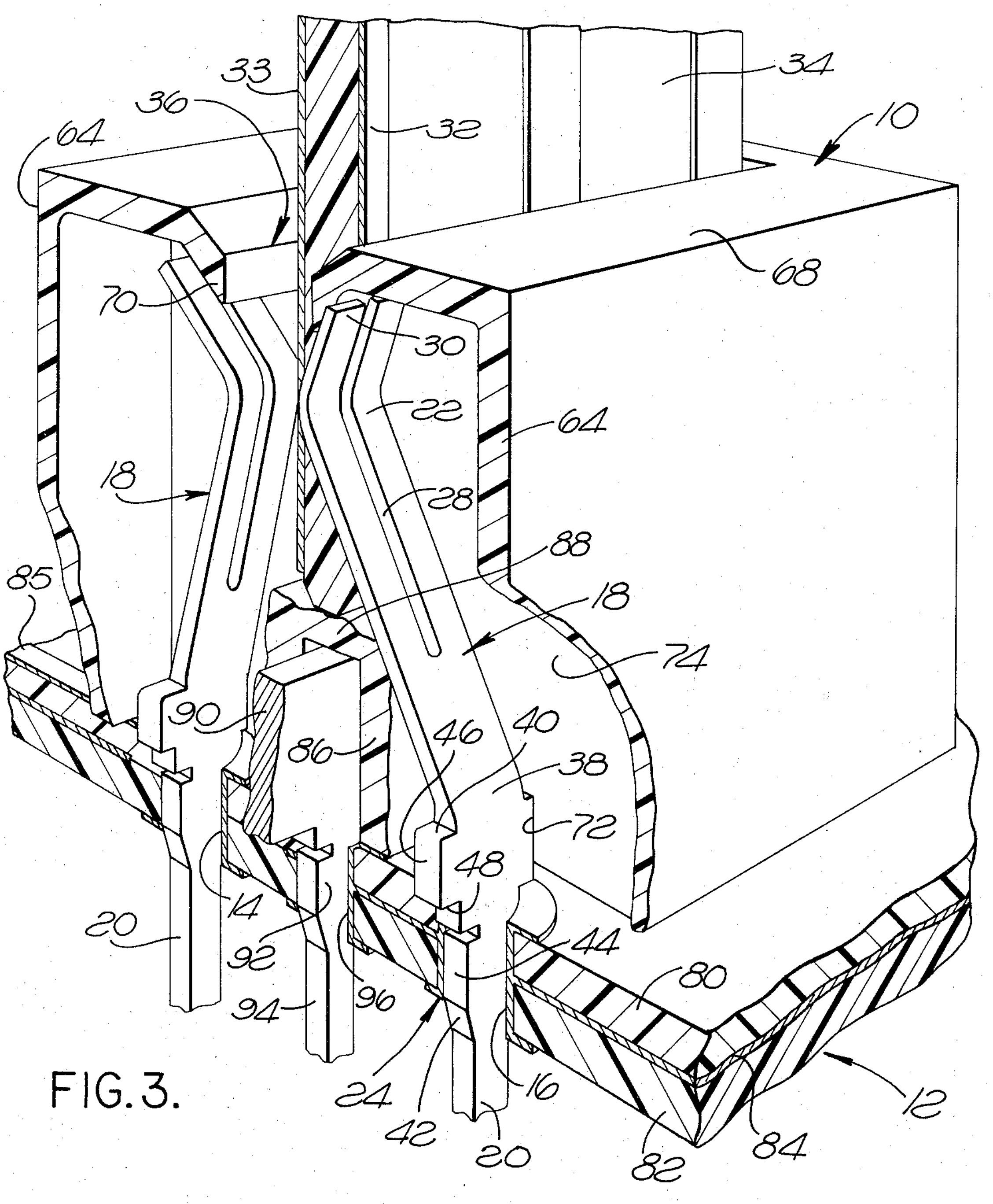
FIG. 3 is an enlarged fragmentary perspective view of the connector of the invention with the edge of a printed circuit board mounted therein.

In accordance with the present invention, the mounting board 12 is constructed as a two-layer laminate, the upper layer 80 being separated from the lower layer 82 by a ground plane 84 which preferably extends to the edges of the board. Each contact which is intended to carry an electrical signal, such as the contact 18 on the left side of the connector housing as viewed in FIGS. 2 and 3, is mounted in a plated through hole 14 which is joined to a signal trace 85 on the top surface of the board 12. Each contact which is intended to provide a ground connection, such as the contact 18 on the right side of the housing as viewed in FIGS. 2 and 3, is mounted in a plated through hole 16 which is joined to the ground plane 84. It is noted that the plated through hole for each signal contact is spaced from the ground plane 84 while the plated through hole for each ground contact is spaced from the signal trace 85.

The lower portion of the housing 10 is formed with an inverted channel 86 intermediate the side walls 64 and below the slot 36. This channel extends between the end walls 66. The upper wall of the channel 88 is disposed below the slot 36 and forms a stop for the printed circuit board 34.

A grounding bus 90 is mounted in the channel 86. The bus comprises an elongated flat vertically extending metal strip which has downwardly depending mounting portions 92 and terminal ends 94 which have a configuration corresponding to the mounting portions 24 and terminal ends 20 of the contacts 18. A third row of plated through holes are provided in the board 12 midway between the rows 14 and 16 of plated through holes. The mounting portions 92 of the grounding bus are press-fit into the plated through holes 96. These holes are joined to the ground plane 84. Thus, it will be appreciated that the contacts 18 and the ground bus 90 are electrically connected to the ground plane by the plated through holes 16 and 96. Since the upper edge of the ground bus 90 is separated from the lower end of the ground trace 32 on the printed circuit board 34 by only the upper wall 88 of the channel 86, only a very small air gap is provided in the ground system, thereby providing matched impedance characteristics in the connector.

Figure 4:
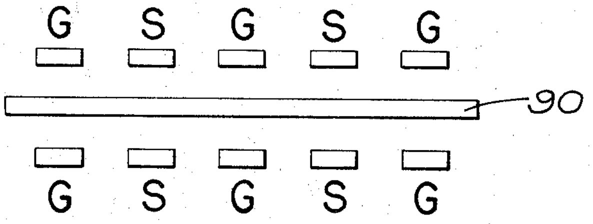
FIG. 4 is a schematic illustration of a preferred arrangement of the ground and signal contacts in the connector of the present invention with respect to the grounding bus therein.

Reference is now made to FIG. 4 which schematically illustrates the preferred arrangement of the contacts in the connector of the present invention with respect to the grounding bus 90. Those contacts which are intended for carrying signals are designated S, while the ground contacts are designated G. It is seen that the ground contacts alternate with the signal contacts on each side of the grounding bus 90. Preferably, each signal contact has a ground contact positioned on opposite side thereof. The grounding bus, together with these two ground contacts, provide a substantially coaxial transmission line arrangement also producing matched impedance characteristics in the connector. Similar, but not quite as effective results, would be achieved by providing a ground contact on only one side of a signal contact. Moreover, in some instances it may not be necessary to provide matched impedance characteristics for a particular signal contact in which case no ground contacts need be mounted adjacent to that signal contact. It will be appreciated that by the present invention, a wide variety of circuit design is obtainable, as the designer may select the desired holes 14 and 16 to be plated through and joined either to a signal trace 85 or the ground plane 84, and the desired contact positioning in the holes to meet the particular circuit application.

While the present invention has been described as being incorporated in a printed circuit board connector of the type disclosed in the aforementioned Mattingly et al. patent, it will be appreciated that the invention could be incorporated in any edge card connector by providing a suitable channel in lower end portion of the connector housing for carrying the grounding bus of the present invention, and by utilizing a suitable mounting board as described herein. In addition, while the connector described herein is a double-sided printed circuit board connector, it will be appreciated that the invention could be as easily embodied in a single-sided printed circuit board connector wherein only two rows of plated through holes would be used in the mounting board 12, one row for the ground bus and the other row for the signal and ground contacts. Other modifications and variations within the scope of this invention will be apparent to those skilled in the art.

What is claimed is:

1. An electrical edge connector for a printed circuit board comprising:

a mounting board having a ground plane and a signal trace separated by an insulator, a plurality of plated through holes in said board, a first plated through hole being connected to said trace, and second and third plated through holes being connected to said ground plane;

an elongated insulative connector housing mounted on said board having a slot therein for receiving the edge of a printed circuit board;

electrical contacts in said housing for engaging said printed circuit board edge;

a grounding bus extending lengthwise in said housing below said slot;

a first contact having a mounting portion mounted in said first plated through hole; and a second contact and said grounding bus having mounting portions mounted in said second and third plated through holes, respectively.

2. A connector as set forth in claim 1 wherein:

said mounting portions of said contacts and said grounding bus have an interference fit with said plated through holes.

3. A connector as set forth in claim 1 wherein:

a row of said third holes is provided in said board in alignment below said slot; and said grounding bus comprises an elongated flat vertically extending metal strip having integral mounting portions depending downwardly therefrom mounted in at least some of said third holes.

4. A connector as set forth in claim 3 wherein:

said housing is formed with a wall positioned over the top of said strip and below said slot.

5. A connector as set forth in claim 1 including:

at least two of said second contacts, said second contacts being positioned in a row on opposite sides of said first contact.

6. A connector as set forth in claim 1 wherein:

there are provided two rows of said contacts in said housing disposed on opposite sides of said grounding bus; and each said row including at least two of said second contacts and one of said first contacts, said second contacts being positioned on opposite sides of said first contact.

7. A connector as set forth in claim 6 wherein:

each said row includes alternating first and second contacts, with second contacts being located at the ends of each said row.

8. A connector as set forth in claim 1 wherein:

said mounting portions of said first and second contacts and said grounding bus are press fit into said plated through holes; and said housing is in the form of a hollow unitary shell open at its bottom and overlying said contacts.

* * * * *